United States Patent
Hsu et al.

(10) Patent No.: US 8,026,603 B2
(45) Date of Patent: Sep. 27, 2011

(54) INTERCONNECT STRUCTURE OF AN INTEGRATED CIRCUIT AND MANUFACTURING METHOD THEREOF

(75) Inventors: Yung-Yu Hsu, Hsinchu (TW); Chih-Yuan Cheng, Hsinchu (TW); Shyi-Ching Liau, Hsinchu (TW); Min-Lin Lee, Hsinchu (TW); Ra-Min Tain, Hsinchu (TW); Rong-Chang Feng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 11/408,072

(22) Filed: Apr. 21, 2006

(65) Prior Publication Data

US 2007/0128845 A1    Jun. 7, 2007

(30) Foreign Application Priority Data

Dec. 2, 2005  (TW) .............................. 94142678 A

(51) Int. Cl.
*H01L 23/52*      (2006.01)
(52) U.S. Cl. ........ 257/739; 257/727; 257/777; 257/778; 257/785; 257/E23.015
(58) Field of Classification Search .................. 257/734, 257/739, 773, 777, 778, 786, E23.015, E23.02, 257/726, 727, 731–733, 785
See application file for complete search history.

(56) References Cited

U.S. PATENT DOCUMENTS

| | | | |
|---|---|---|---|
| 5,889,657 A * | 3/1999 | Kono | 361/773 |
| 6,352,436 B1 | 3/2002 | Howard | |
| 7,015,580 B2 * | 3/2006 | Fitzsimmons et al. | 257/739 |
| 2006/0108685 A1 * | 5/2006 | Tsou et al. | 257/737 |
| 2006/0290343 A1 * | 12/2006 | Crafts et al. | 324/158.1 |

* cited by examiner

*Primary Examiner* — Matthew E Warren
(74) *Attorney, Agent, or Firm* — Birch, Stewart, Kolasch & Birch, LLP

(57) ABSTRACT

An interconnect structure of an integrated circuit and manufacturing method therefore are provided, relating to an interconnect structure of flexible packaging. The interconnect structure includes a first and a second conductive pads. A plurality of tiny and conductive first pillars is respectively formed on the first and second pads. With different densities and thicknesses of the first and second pillars, a contact strength can be generated when the pillars interconnecting with each other, such that the pillars are connected closely. Furthermore, the interconnect structure can also be used to connect with fibers made of conductive materials. Moreover, the higher the density of the pillars, the stronger the contact strength. And, electronic substrates and active or passive electronic elements can be stuck on the other side of each pad. Therefore, the interconnect structure can maintain flexibility and have high reliability without being enhanced by any thermosetting polymer.

12 Claims, 13 Drawing Sheets

INTERCONNECT STRUCTURE OF AN INTEGRATED CIRCUIT AND MANUFACTURING METHOD THEREOF

CROSS-REFERENCE TO RELATED APPLICATIONS

This non-provisional application claims priority under 35 U.S.C. §119(a) on Patent Application No(s). 094142678 filed in Taiwan, R.O.C. on Dec. 2, 2005, the entire contents of which are hereby incorporated by reference.

BACKGROUND OF THE INVENTION

1. Field of Invention

The present invention relates to an interconnect structure and manufacturing method therefor, and more particularly relates to an interconnect structure of an integrated circuit and manufacturing method therefor.

2. Related Art

Recently, with the rapid development of technology, people enjoy a better life due to the active research and hard work of scientists. It is the most urgent subject in the future for scientists to research, develop, and manufacture compact and light in weight devices which are safe, environment friendly, portable, and wearable along with the development of multi-functional electronic products. Therefore, it becomes one of the main development directions to develop flexible semiconductor packaging. However, in recent research of flexible electronic packaging, there is no solution that meets the requirement of flexibility directed to the interconnection between individual devices.

The current interconnect structures presented employ a surface mount process, wherein a solder between the electronic substrates must be employed to accomplish the connection. The process is rather bothersome and cannot provide flexibility, and the contacts cannot bear the thermal stress caused by heat. If the connected substrates need to separate, the solder should be heated to about 220° C. and melted, and then the connected substrates can be separated; Therefore, solder residue may remain on the substrates, affecting the performance. So, it will be a great benefit for the public to develop a flexible interconnect structure that can be interconnected or disconnected easily.

SUMMARY OF THE INVENTION

The object of the present invention is to provide an interconnect structure of the integrated circuit and manufacturing method therefor. With the concept of, for example, fastening tape, a plurality of pillars having different sizes, shapes, and densities is formed on different pads, such that the two pads are closely engaged with each other after they interconnect. Since the pillars are tiny and flexible, users can separate the two pads just by tearing along the edge, thereby solving the problem in the prior art.

Therefore, to achieve the above object, an interconnect structure of the integrated circuit and manufacturing method therefor disclosed in the present invention are used for interconnecting a first substrate and a second substrate. A first pad is attached on the first substrate, and a second pad is attached on the second substrate. Then, a plurality of first pillars is formed on the first pad, and a plurality of second pillars is formed on the second pad. The distribution densities, shapes, thicknesses, and sizes of the first pillars and the second pillars can be different. By cross-connecting the plurality of first pillars and the plurality of second pillars, the first substrate and the second substrate can be interconnected, the concept of which is similar to cross-connecting two combs with different thicknesses and densities, such that a tight engagement can be achieved.

The first and second pads and the first and second pillars formed thereon are made of a conductive material, for transmitting the electrical signals sent by the first substrate and the second substrate.

Moreover, with the interconnect structure of the integrated circuit of the present invention, in addition to interconnecting electronic substrates, the electronic substrate can be interconnected with an object having fibers, for example, clothes having conductive fibers. The electronic substrate is adhered to a pad, in which a plurality of pillars is formed. The pad and the pillars are made of conductive materials. Each pillar is cross-connected with the fibers, thus the electronic substrate or the electronic device constituted of electronic substrate can be attached to the object having conductive fibers.

In addition to achieving the property of flexibility, the special contact design can absorb the stress resulting from thermal or flexible deformation. In the structure, a plurality of tiny pillars made of conductive materials is formed on the both sides of the contact surface. With the different densities and thicknesses of the pillars on both sides, a tight connecting can be achieved due to the contact strength generated when both sides interconnecting with each other. And the other corresponding side of the contact surface can be of a same structure, and also can be fibers made of conductive materials, such that the conductive hooks can be connected closely. The higher the density of the hooks is, the stronger the contact strength is. And the conductive pillars on both sides of the contact surface are interconnected by using different distribution densities and thicknesses.

The detailed features and advantages of the present invention will be described in detail in the following embodiments, the content thereof is sufficient to make any skilled in the art to understand the technical content of the present invention and implement accordingly. And any skilled in the art can easily understand the related objects and advantages of the present invention according to the disclosure, claims and drawings of the present specification.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only for, and which thus is not limitative of the present invention, and wherein.

DETAILED DESCRIPTION OF THE INVENTION

In order to further illustrate the objects, structures, features, and functions of the present invention, it is described in detail with embodiments. The illustration related to the content of the present invention described above and the following detailed description of the present invention are used for illustrating and explaining the principle of the present invention, and for providing a further explanation of the claims of the present invention.

Figure 1A:
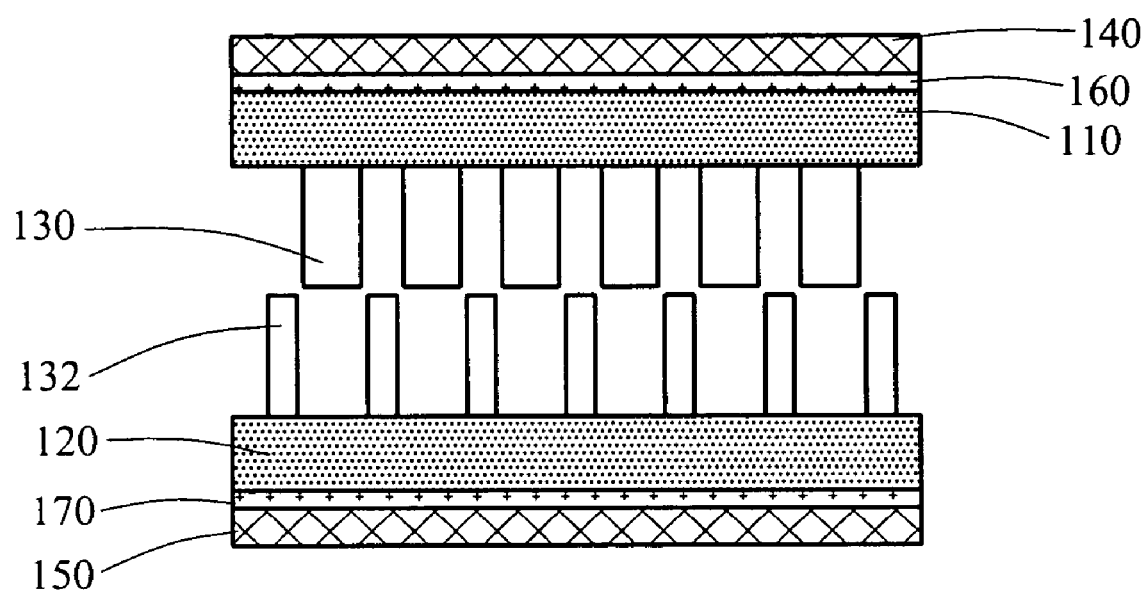
FIG. 1A and FIG. 1B are schematic views of an interconnect structure of an integrated circuit according to a first embodiment of the present invention.

Referring to FIG. 1A, it shows a schematic view of an interconnect structure of an integrated circuit according to a first embodiment of the present invention for interconnecting a first substrate 140 and a second substrate 150. The interconnect structure comprises a first pad 110, a plurality of first pillars 130, a second pad 120, and a plurality of second pillars 132, which are all made of conductive materials.

The first substrate 140 is attached on one side of the first pad 110, and a plurality of first pillars 130 is formed on the other side of the first pad 110. The second substrate 150 is attached on one side of the second pad 120, and a plurality of second pillars 132 is formed on the other side of the second pad 120. The distribution density of the first pillars 130 is different from that of the second pillars 132. The shapes, sizes, and thicknesses of the first pillars 130 and the second pillars 132 are different as well. The pillar may be column-shaped, taper-shaped, or hook-shaped. And the arrangement of the first pillars 130 and the second pillars 132 on the pad may be an area array, a peripheral arrangement, or an individual contact arrangement. Similar to the conception of the fastening tape, the plurality of first pillars 130 and the plurality of second pillars 132 are cross-connected because of the different distribution densities of the pillars, so the first substrate 140 and second substrate 150 can be interconnected closely.

Moreover, a first conductive layer 160 can be further provided between the first pad 110 and the first substrate 140, and a second conductive layer 170 can be further provided between the second pad 120 and the second substrate 150. The conductive layers are used for transmitting the electrical signals sent by the first substrate 140 and the second substrate 150. The attaching method between the first pad 110, the first substrate 140, and the first conductive layer 160 can be implemented by one of direct interconnect, alloy reflow interconnection, adhesion, and lamination. The attaching method of the second pad 120, the second substrate 150, and the second conductive layer 170 is the same as the above.

Figure 1B:
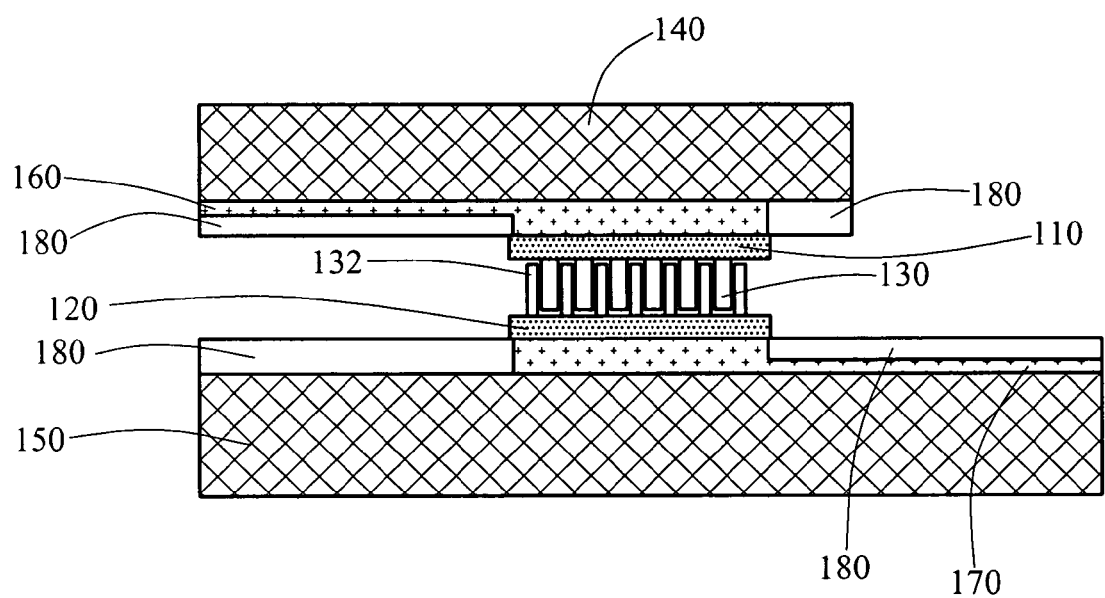

Referring to FIG. 1B, it shows a schematic view of the interconnect structure of the integrated circuit of FIG. 1A after interconnection, which is similar to cross-connecting two combs having different density and thickness to accomplish an interconnection. In addition, a protective layer 180 is used for protecting the first substrate 140, the second substrate 150, the first conductive layer 160, and the second conductive layer 170 made of conductive materials, and to provide an effect of isolating them from foreign objects.

Figure 2A:
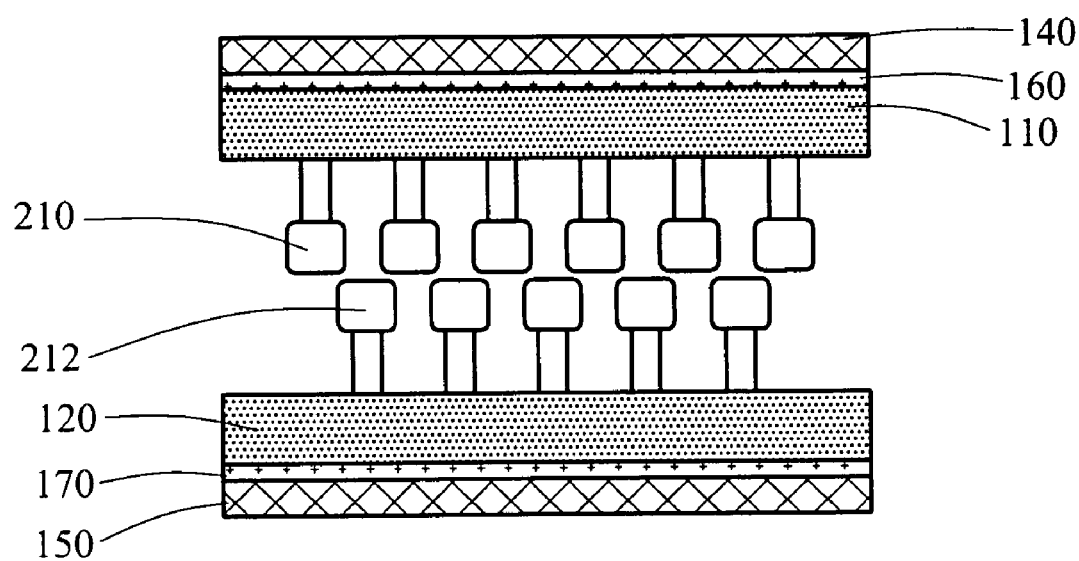
FIG. 2A and FIG. 2B are schematic views of an interconnect structure of an integrated circuit according to a second embodiment of the present invention.
Figure 2B:
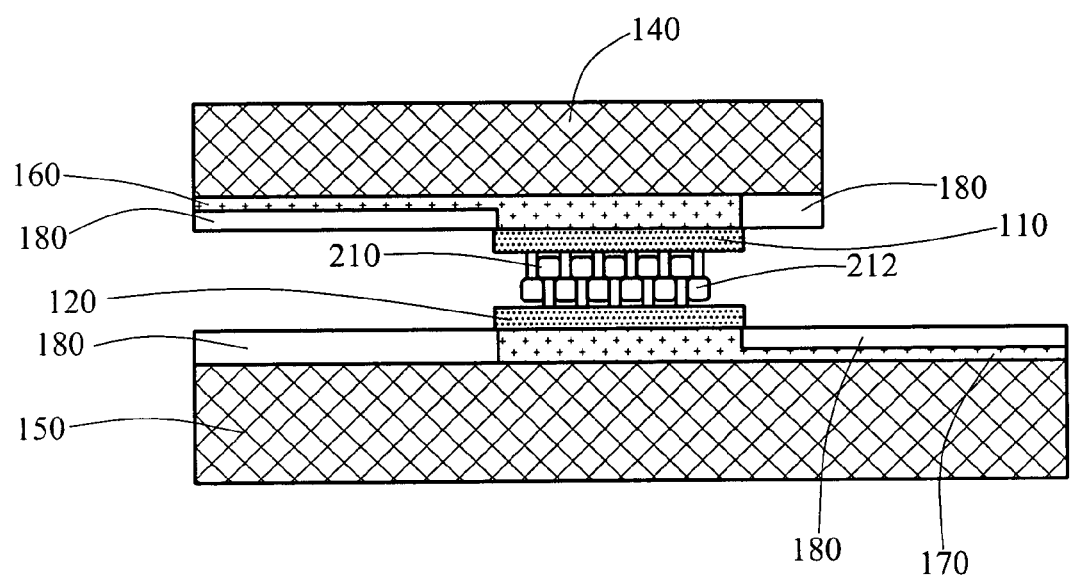

Referring to FIG. 2A, it shows a schematic view of an interconnect structure of the integrated circuit according to a second embodiment of the present invention. It can be seen from the drawing that the shape of the first pillars 210 and the second pillars 212 is the same, and the structure of pillars is constituted of a relatively thin pillar and a relatively thick pillar. FIG. 2B is a schematic view of the interconnect structure of FIG. 2A after interconnection. The interconnect structure can provide a superior interconnection effect. Since each pillar is tiny, the structure is flexible, such that the structure can be easily disconnected just by tearing along the edge. In other words, the plurality of first pillars 210 and the plurality of second pillars 212 are detachably cross-connected to interconnect the first substrate 140 and the second substrate 150. In addition, the first substrate 140 and the substrate 150 are engaged closely after interconnection. Further, the interconnect structure is flexible and capable of bearing the flexible deformation.

Figure 3:
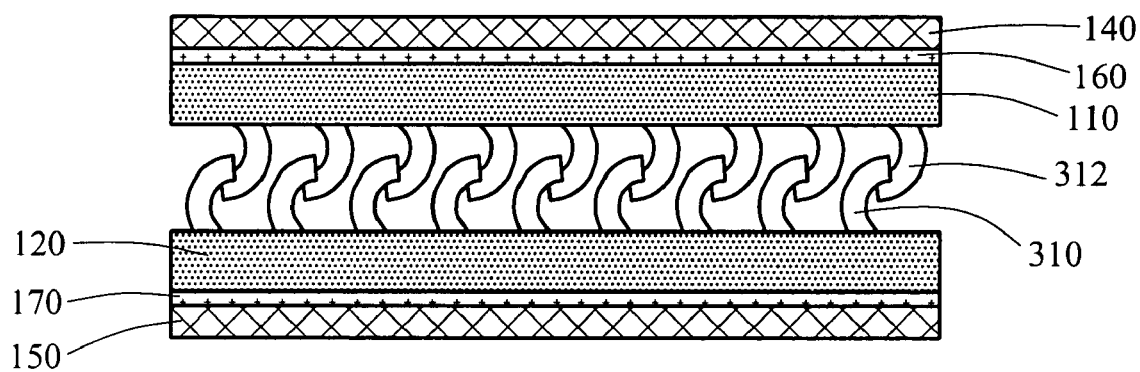
FIG. 3 is a schematic view of an interconnect structure of an integrated circuit according to a third embodiment of the present invention.
Figure 4:
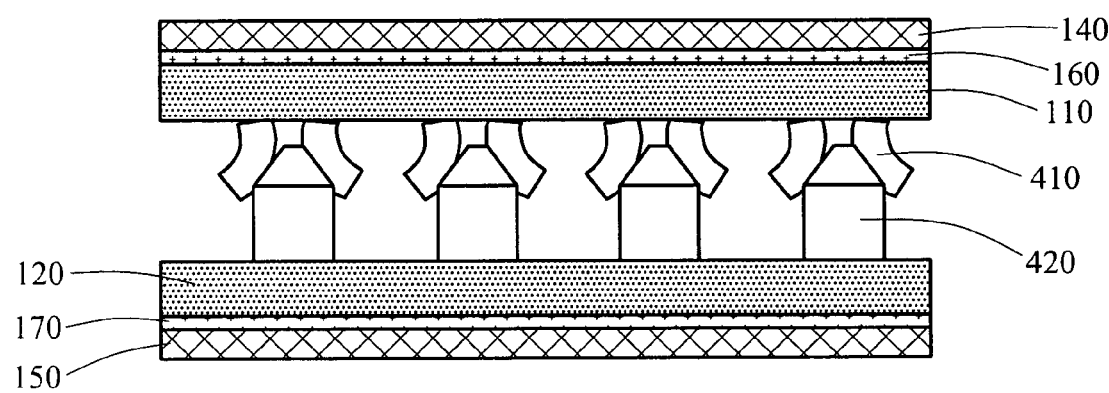
FIG. 4 a schematic view of an interconnect structure of an integrated circuit according to a fourth embodiment of the present invention.

FIG. 3 is a schematic view of an interconnect structure according to a third embodiment of the present invention. The first pillars 312 and second pillars 310 are hook-shaped. And the same structures at two sides can be engaged closely after interconnection. Also, FIG. 4 is a schematic view of an interconnect structure according to a fourth embodiment of the present invention, wherein the first pillars 410 are column-shaped, and the second pillars 420 are taper shaped, for cross-connecting to accomplish the interconnection.

Figure 5A:
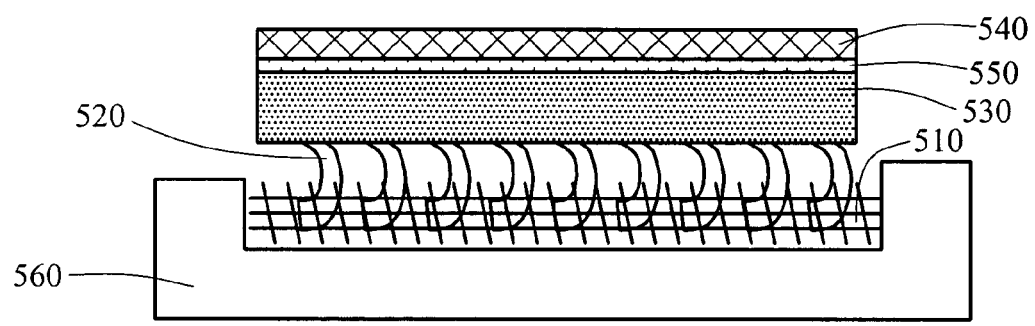
FIG. 5A is a schematic view of a structure interconnected with an object having fibers according to a fifth embodiment of the present invention.

In the present invention, the interconnect structures can be connected with each other, and further, the interconnect structure can be interconnected with an object 560 having fibers. Referring to FIG. 5A, a conductive pad 530 is attached on one side of a substrate 540 with electronic elements, and a plurality of conductive pillars 520 is formed on the pad 530. The pillars in FIG. 5A are hook-shaped, and the arrangement of the pillars 520 on the pad 530 can be an area array, a peripheral arrangement, or an individual contact arrangement. The hooks are cross-connected with the fibers 510, so as to accomplish the interconnection with the substrate 540.

The material of fibers 510 is a conductive material, and the fibers can be weaved in clothes, thus the electronic substrate can stick to the cloths and be wearable. Moreover, a conductive layer 550 is further provided between the substrate 540 and the pad 530, for transmitting electrical signals sent by the substrate 540. And the process for attaching between the substrate 540, the pad 530, and the conductive layer 550 can be implemented by one of direct interconnection, alloy reflow interconnection, adhesion, or lamination.

Figure 5B:
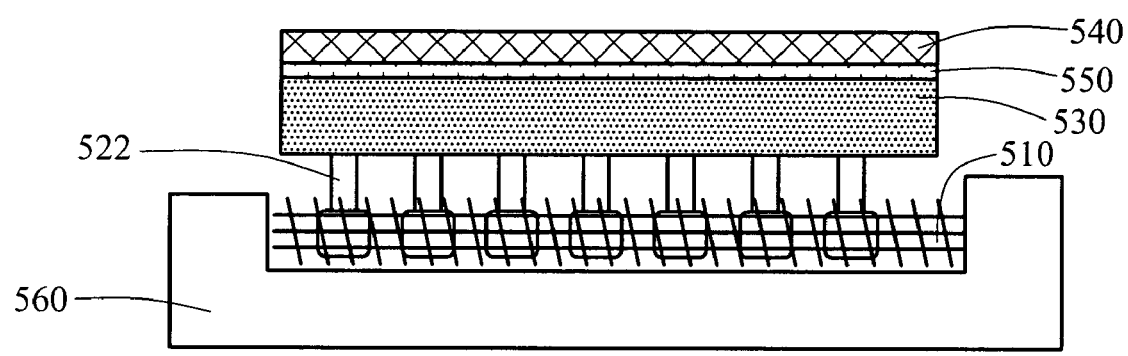
FIG. 5B is a schematic view of a structure interconnected with an object having fibers according to a sixth embodiment of the present invention.
Figure 5C:
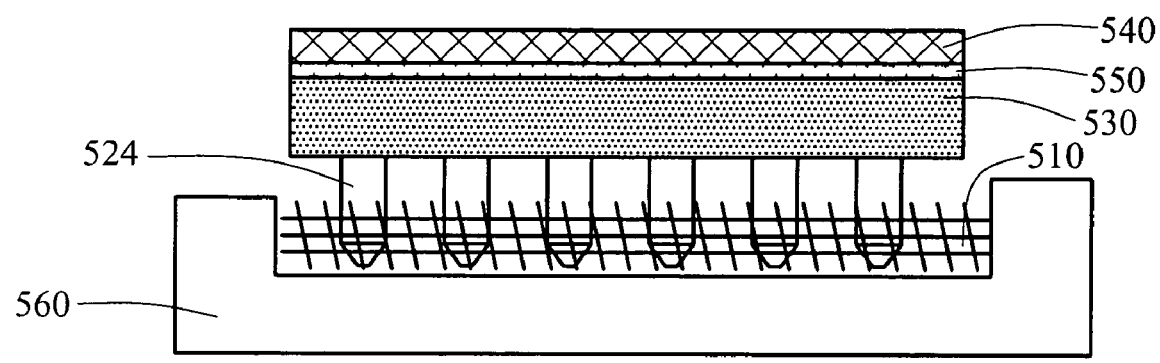
FIG. 5C is a schematic view of a structure interconnected with an object having fibers according to a seventh embodiment of the present invention.

In FIG. 5B, the shape of pillars 522 is constituted of a thin pillar and a thick pillar. And in FIG. 5C, the pillars 524 are taper-shaped, and the pillars 522, 524 can be detachably inserted in the object 560 having fibers 510, such as clothes having fibers 510.

Figure 6A:
FIGS. 6A to 6N are flow charts of manufacturing the interconnect structure of the present invention.
Figure 6B:
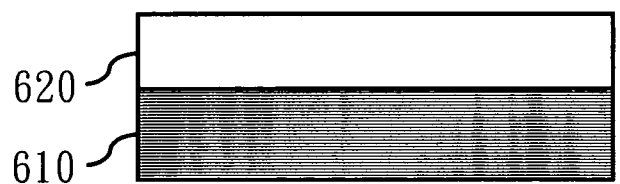
Figure 6C:
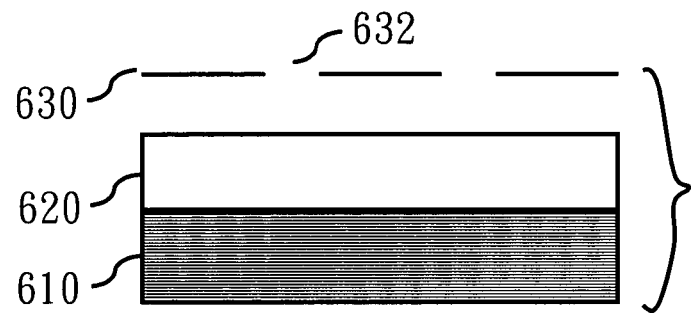
Figure 6D:
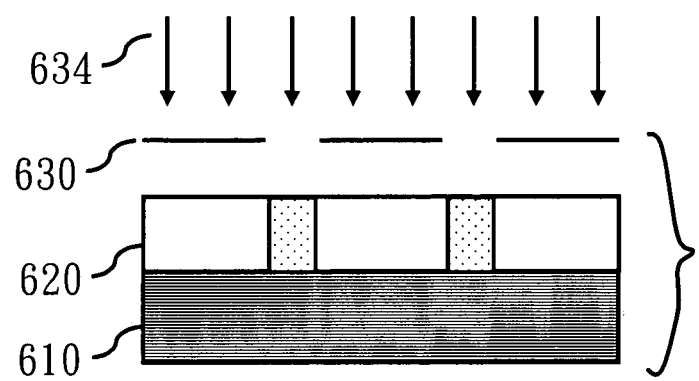
Figure 6E:
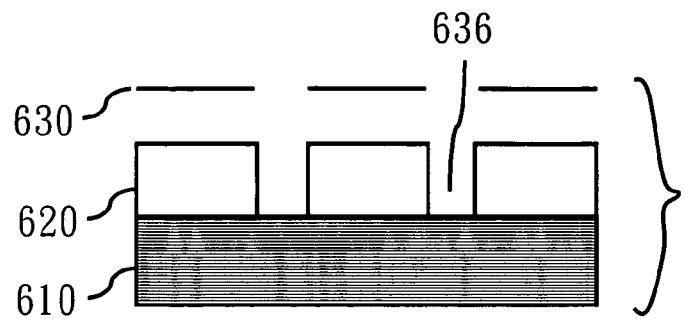
Figure 6F:
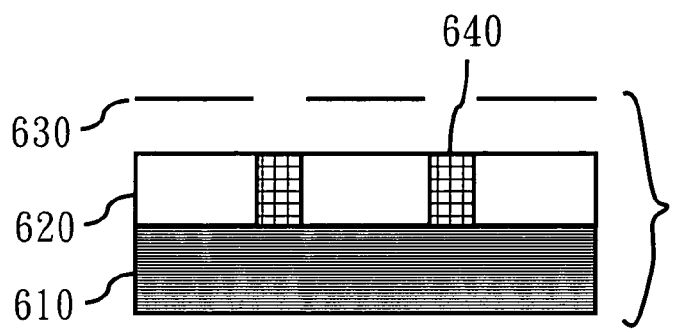
Figure 6G:
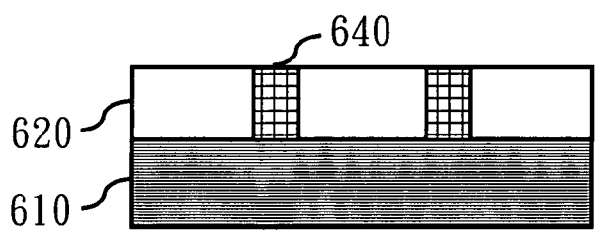
Figure 6H:
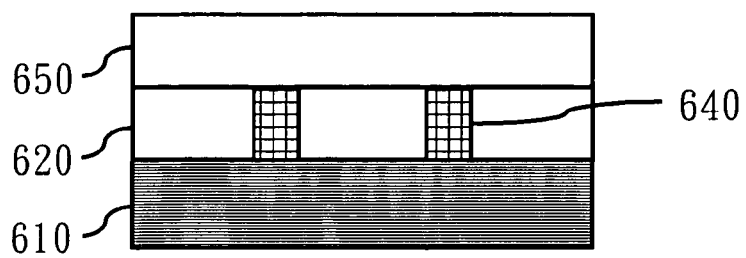
Figure 6I:
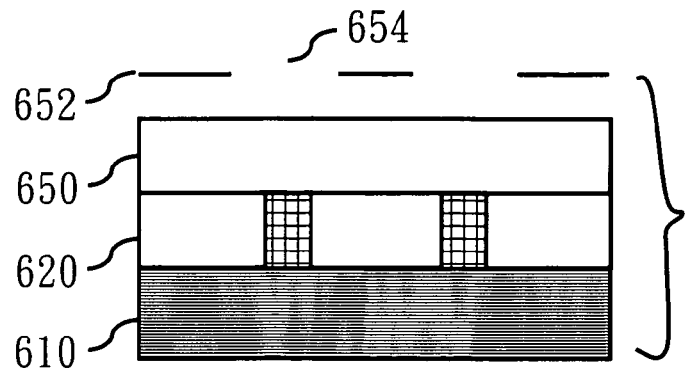
Figure 6J:
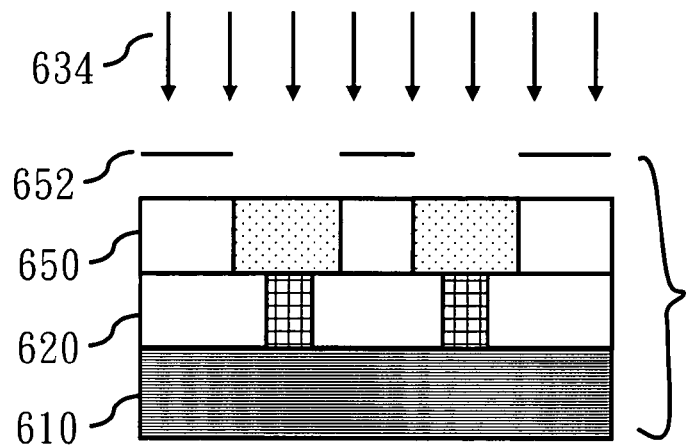
Figure 6K:
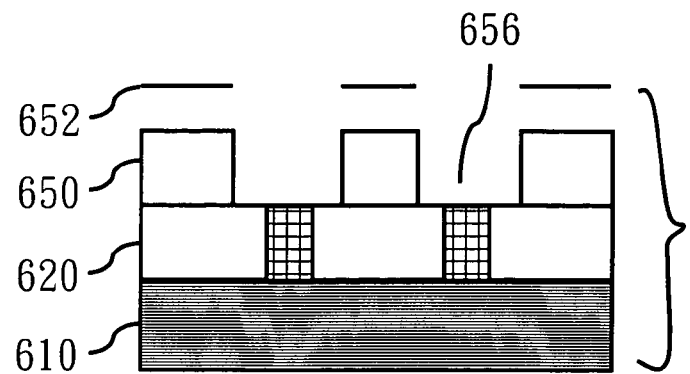
Figure 6L:
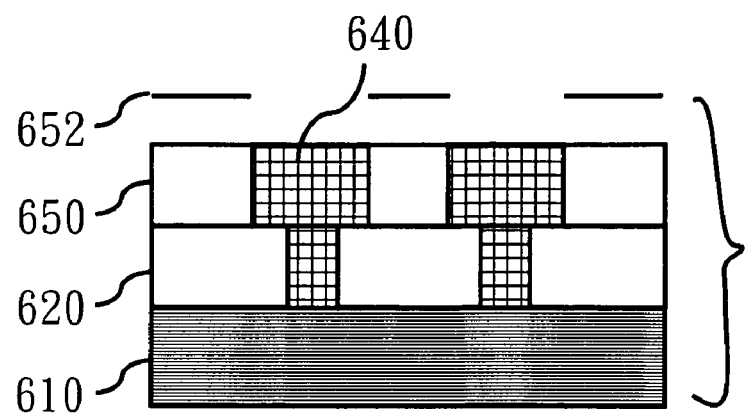
Figure 6M:
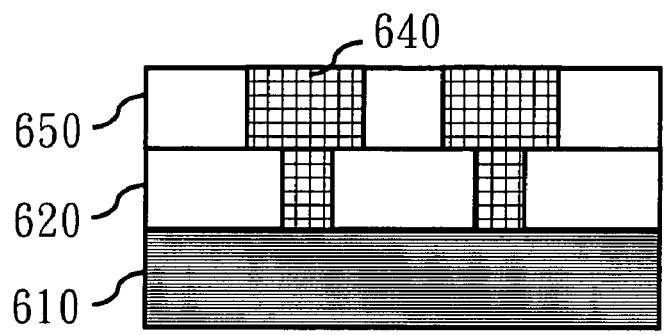
Figure 6N:
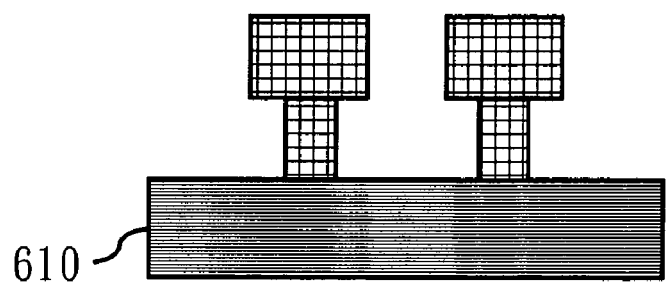

Finally, referring to FIGS. 6A to 6N, they are flow charts of process of manufacturing the interconnect structure of a shape as in FIG. 2A. First, a pad 610 is provided. Then, a first photoresist layer 620 is coated on the pad 610. A first mask 630 is placed on the first photoresist layer 620, wherein the first mask 630 is provided with a plurality of holes 632, for exposing the first photoresist layer 620 to an exposure light 634 through the first mask 630. Thereafter, the first photoresist layer 620 is developed. Then, all exposed portions of the first photoresist layer 620 are removed. The each exposed portion is corresponding to the position of each hole of the first mask 630, thus a plurality of first column-shaped holes 636 is formed. Subsequently, a conductive material 640 is filled in each of the first column-shaped holes 636. Then, the first mask 630 is removed, thus the first parts of pillars are completed.

A second photoresist layer 650 is coated on the first photoresist layer 620, and a second mask 652 is placed on the second photoresist layer 650, wherein the second mask 652 is provided with a plurality of holes 654, and the position of each hole 654 corresponds to the position of each of the first column-shaped holes 636. The hole 654 is slightly wider than the first column-shaped hole 636. Thereafter, the second photoresist layer 650 is exposed to the exposure light 634 through the second mask 652. Then, the second photoresist layer 650 is developed. Next, all exposed portions of the second photoresist layer 650 are removed, and the each exposed portion is corresponding to the position of each hole of the second mask 652, thus a plurality of second column-shaped holes 656 is formed. Then, the conductive material 640 is filled in each of the second column-shaped holes 656, and the second mask 652 is removed. Finally, a part of the first photoresist layer 620 and a part of the second photoresist layer 650 without being filled with the conductive material 640 are removed together by etching, thus the interconnect structure of the integrated circuit of the present invention is completed. This interconnect structure can provide a superior interconnection effect.

The present invention relates to an interconnect structure of flexible packaging, which provides a special interconnect structure design to allow the packaging to maintain flexibility. The contact surface is also capable of bearing the flexible deformation, and absorbing the thermal stress generated by heat. Therefore, the present invention not only has the property of flexibility, but also has a relatively high reliability.

With the concept of fastening tape, the connecting is flexible and capable of absorbing thermal stress caused by mismatch of the coefficient of thermal expansion, and in conjunction with flexibility of the thin chips and the flexible substrate, a flexible packaging can be obtained. A plurality of small hooks or various clip structures is manufactured on the pad. And the same structures at two sides can be engaged closely after interconnection. Though the binding force generated is small, if the number increases, a relatively strong binding force will be generated. And such a design allows a structure to be separated easily just by tearing along the edge, thus the advantages of convenient displacement and reuse can be achieved. In addition, the other side of the contact surface can have tightly woven metal fibers in addition to the same structure. The present invention can maintain flexibility without thermosetting polymer for enhancing flexibility, and the interconnect structure itself has the property of flexibility such that it can bear deformation when flexed, thus having high reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A structure of an integrated circuit for interconnecting or disconnecting a first substrate and a second substrate, comprising:
a first pad, attached on a first substrate;
a plurality of first pillars, formed on the first pad with a first density;
a second pad, attached on a second substrate; and
a plurality of second pillars, formed on the second pad with a second density;
wherein the plurality of first pillars and the plurality of second pillars are detachably cross-connected without bonding material between the first and second pillars to interconnect or disconnect the first substrate and the second substrate, the shape of the first pillars and the second pillars is one of column-shaped, taper-shaped, and hook-shaped, and the shapes, sizes, or thicknesses of the first pillars and the second pillars are different.

2. The structure of an integrated circuit as claimed in claim 1, wherein a conductive layer is further respectively included between the first pad and the first substrate and between the second pad and the second substrate, for transmitting electrical signals.

3. The structure of an integrated circuit as claimed in claim 1, wherein the arrangement of the each first pillar and the each second pillar is selected from the group consisting of an area array, a peripheral arrangement, and an individual contact arrangement.

4. The structure of an integrated circuit as claimed in claim 1, wherein the material of the first substrate and the second substrate is a conductive material.

5. The structure of an integrated circuit as claimed in claim 1, wherein the material of the first pad and the second pad is a conductive material.

6. The structure of an integrated circuit as claimed in claim 1, wherein the material for the first pillars and the second pillars is a conductive material.

7. The structure of an integrated circuit as claimed in claim 1, wherein the first substrate and the substrate are engaged closely after interconnection.

8. The structure of an integrated circuit as claimed in claim 1, wherein the structure is flexible and capable of bearing the flexible deformation.

9. The structure of an integrated circuit as claimed in claim 1, wherein the shape of the first pillars and the second pillars is column-shaped, and the structure of the first and the second pillars is constituted of a relatively thin pillar and a relatively thick pillar.

10. The structure of an integrated circuit as claimed in claim 1, wherein the shape of the first pillars is column-shaped, and the shape of the second pillars is hook-shaped.

11. The structure of an integrated circuit as claimed in claim 1, wherein the shape of the first pillars is taper-shaped, and the shape of the second pillars is hook-shaped.

12. A structure of an integrated circuit for interconnecting or disconnecting a first substrate and a second substrate, comprising:
a first pad, attached on a first substrate;
a plurality of first pillars, formed on the first pad with a first density;
a second pad, attached on a second substrate; and
a plurality of second pillars, formed on the second pad with a second density;
wherein the plurality of first pillars and the plurality of second pillars are detachably cross-connected without bonding material between the first and second pillars to interconnect or disconnect the first substrate and the second substrate, the shape of the first pillars and the second pillars is one of column-shaped, taper-shaped, and hook-shaped, and the shape of the first pillars is column-shaped, and the shape of the second pillars is taper-shaped.

* * * * *